(12) United States Patent
Bell

(10) Patent No.: US 7,595,720 B2
(45) Date of Patent: Sep. 29, 2009

(54) ACTIVE WHEEL SPEED SENSOR TESTER

(75) Inventor: Christopher Bell, Detroit, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 12/046,344

(22) Filed: Mar. 11, 2008

(65) Prior Publication Data
US 2008/0148806 A1      Jun. 26, 2008

Related U.S. Application Data

(62) Division of application No. 11/514,731, filed on Aug. 31, 2006, now abandoned.

(51) Int. Cl.
*B60C 23/001*      (2006.01)
(52) U.S. Cl. ....................................... 340/438
(58) Field of Classification Search ................. None
See application file for complete search history.

(56) References Cited

U.S. PATENT DOCUMENTS

| | | | |
|---|---|---|---|
| 4,756,186 A * | 7/1988 | Sangawa | ................. 73/114.61 |
| 4,831,868 A | 5/1989 | Makino | |
| 4,837,552 A | 6/1989 | Vandemotter et al. | |
| 4,912,969 A | 4/1990 | Ishizeki | |
| H964 H * | 9/1991 | Olson et al. | .................. 324/174 |
| 5,265,468 A | 11/1993 | Holst et al. | |
| 5,369,991 A * | 12/1994 | Armstrong | |
| 5,844,411 A * | 12/1998 | Vogt | ........................... 324/537 |
| 5,923,161 A | 7/1999 | Frankovitch, Jr. et al. | |
| 6,114,952 A | 9/2000 | Francesangeli et al. | |
| 6,382,018 B2 | 5/2002 | Knestel | |
| 2005/0010341 A1 | 1/2005 | MacNamara et al. | |
| 2005/0262921 A1 | 12/2005 | Arntz et al. | |

FOREIGN PATENT DOCUMENTS

| | | |
|---|---|---|
| EP | 0664461 | 7/1995 |
| WO | 09421502 | 9/1994 |
| WO | 05052604 | 6/2005 |

* cited by examiner

*Primary Examiner*—Robert R Raevis
(74) *Attorney, Agent, or Firm*—Frederick Owens; Alleman Hall McCoy Russell & Tuttle LLP

(57) ABSTRACT

A tester for testing an active wheel speed sensor of a vehicle, comprising: a module testing portion to assess operation of a system control module by monitoring an electrical output from the system control module and to indicate proper operation of the system control module with a first indicator; and a sensor testing portion to assess the operation of the active wheel speed sensor and to indicate proper operation with a second indicator.

9 Claims, 6 Drawing Sheets

ACTIVE WHEEL SPEED SENSOR TESTER

The present application is a divisional of U.S. patent application Ser. No. 11/514,731, entitled "ACTIVE WHEEL SPEED SENSOR TESTER", filed Aug. 31, 2006, the entire contents of which are incorporated herein by reference.

FIELD OF INVENTION

The present disclosure relates to testing an active wheel speed sensor.

BACKGROUND

Active wheel speed sensors can be used to determine the speed of vehicle wheels and to provide that information to vehicle control modules, such as, for example, an anti-lock brake system (ABS). At times it may be desirable to test a wheel speed sensor to determine whether it is properly functioning. Many types of active wheel sensors have previously been tested while connected to the vehicle wiring harness through a breakout box. This process can be cumbersome and time consuming.

One type of sensor testing approach is described in U.S. Patent Application 2005/0262921. The disclosed tester is for in situ testing of an active wheel speed sensor, and includes a window comparator block that creates voltage outputs representing pass-fail criteria for the active sensor. The output of the comparator is connected to a plurality of LEDs. Illumination of the LEDs indicates the operating states of the sensor, such as valid high state, valid low state, open circuit, short circuit, etc.

The inventor herein has recognized several disadvantages with the sensor testing solution of U.S. Patent Application 2005/0262921. In particular, the tester may not be used to easily test the sensors in various different vehicles, since different vehicle models may have different wiring harness connectors, and the sensors and/or wiring harnesses may employ different polarities. Furthermore, the above device is not configured to identify problems associated with the ABS circuit or wiring, which may result in erroneous messages that the sensor is malfunctioning.

SUMMARY

To address at least some of the above issues, a tester for testing an active wheel speed sensor of a vehicle is provided. The tester comprises a module testing portion to assess operation of a system control module by monitoring an electrical output from the system control module and to indicate proper operation of the system control module with a first indicator; and a sensor testing portion to assess the operation of the active wheel speed sensor and to indicate proper operation with a second indicator. In one embodiment, the module testing portion checks that the ABS module is supplying power to the sensor while the sensor testing portion which is electrically isolated and powered by its own battery tests the sensor only.

In this way, the testing portion on the system control module in the tester enables a check on the circuit of the system control module and the identification of problems associated with the module. Thus, actual testing of the current state in the sensor may not be needed in some situations, which may simplify the diagnostic process significantly.

According to another aspect, a polarity switch is provided in the tester wherein the illumination of some LEDs can indicate the proper polarity connection between the tester and the sensor circuit. Alternatively, the polarity switch may be flipped to the correct polarity for specific type of vehicle based on information provided with the tester. Such configuration can facilitate and smooth the testing process.

According to yet another aspect, a connector detachably attached to a tester is provided. Thus, the wheel speed sensor tester can be used to test the sensor in variety types of vehicles.

BRIEF DESCRIPTION OF THE DRAWINGS

FIG. 6 shows exemplary embodiments of a detachable connector, where

DETAILED DESCRIPTION OF PREFERRED EMBODIMENTS

Active wheel speed sensors may be implemented with an integrated circuit and magnet. The integrated circuit may contain magnetic field reactive components, such as Hall Effect sensors, which detect changes in the magnetic field across the sensing unit. The active wheel speed sensor can be located near a rotating toothed tone wheel that is connected to the vehicle axle. When a tooth from the tone wheel passes near the wheel speed sensor, the magnetic field from the magnet is distorted. The change in the magnetic field can be sensed by the magnetic field reactive components. As a result, the current in the sensor can be changed. In some embodiments, the sensor may have a "low" and a "high" states defined by a current flow. An electronic control module in a vehicle such as the antilock brake system electronic control module may monitor the current level from the sensor circuit. Each transition from high to low may be related to the passing of a wheel tooth and thus can be used to derive wheel speed or vehicle speed.

Figure 1:
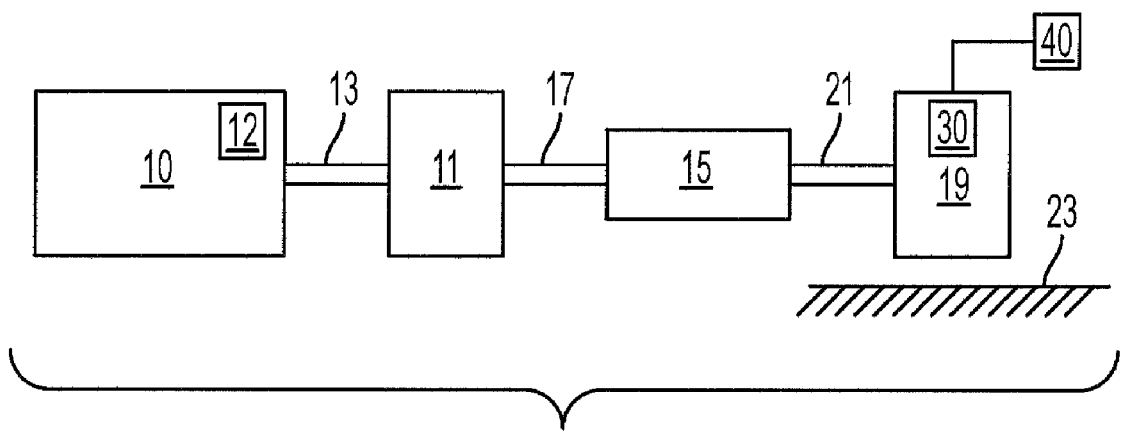
FIG. 1 is a block diagram of a vehicle illustrating various components related to the present application.

Referring to FIG. 1, the figure shows a vehicle powertrain with which an active wheel speed sensor may be employed. Internal combustion engine 10 is shown coupled to torque converter 11 via crankshaft 13. Torque converter 11 is also coupled to transmission 15 via turbine shaft 17. Torque converter 11 has a bypass clutch (not shown) which can be engaged, disengaged, or partially engaged. When the clutch is either disengaged or partially engaged, the torque converter is said to be in an unlocked state. Turbine shaft 17 is also known as transmission input shaft. Transmission 15 comprises an electronically controlled transmission with a plurality of selectable discrete gear ratios. Transmission 15 also comprises various other gears, such as, for example, a final drive ratio (not shown). Transmission 15 is also coupled to wheel 19 via axle 21. Wheel 19 interfaces the vehicle (not shown) to the road 23. Note that in one example embodiment, this powertrain is coupled in a passenger vehicle that travels on the road. Further, the vehicle may have an anti-lock braking system (ABS) that is coupled in the brake system (not shown).

Engine 10 includes an electronic engine controller 12 which receives various signals from sensors coupled to engine 10 and other portions of the vehicle. Controller 12 may control ABS in response to information from wheel speed sensor 30 that may be located near vehicle axle 21. Alternatively, ABS may have a separate system control module that operates the ABS based on information from wheel speed sensor 30. Wheel speed sensor tester 40 may be employed to diagnose the functioning of wheel speed sensor 30.

Figure 2:
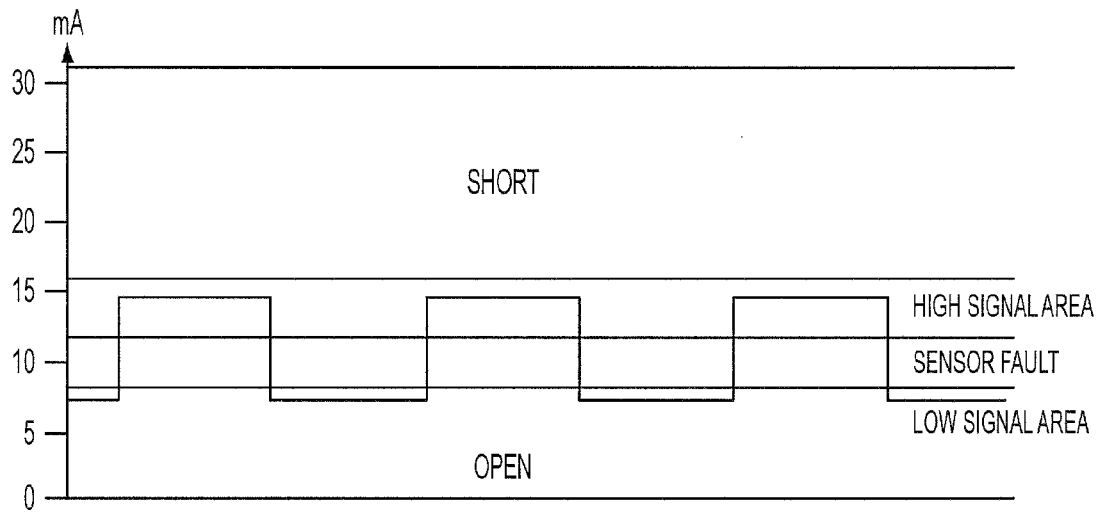
FIG. 2 shows exemplary high and low signal bands for an active wheel speed sensor.

FIG. 2 shows exemplary high and low signal bands for an active wheel speed sensor. The active wheel speed sensor, such as a Hall Effect sensor, may have two states defined by certain current ranges. In the depicted example, the low state may be defined by a current flow of between 4 and 8 milliamps (mA), and a high state may be defined by a current flow of between 12 and 16 mA. It should be noted that the current ranges may vary depending on the circuit configuration of the specific sensors.

When the current is below the low state, the circuit may be considered to be open. When the current is in the range between low and high states, there may be an error in the circuit. As the current increases above the high state, the circuit can be deemed to be shorted.

Figure 3:
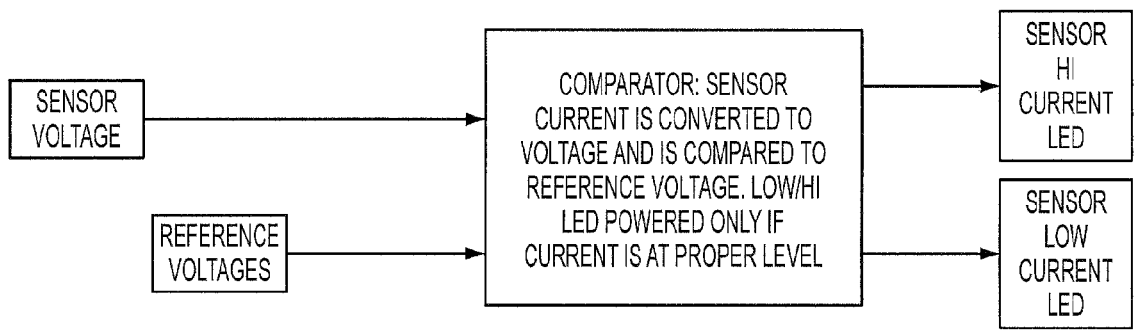
FIG. 3 shows an exemplary tester process diagram for an active wheel speed sensor, in which the sensor is diagnosed.

The wheel speed sensor may be tested to diagnose whether it is functioning properly. FIG. 3 shows an exemplary tester process diagram for an active wheel speed sensor tester, in which the sensor is diagnosed. The sensor may include a Hall Effect sensor or any suitable active wheel speed sensor. In the depicted embodiment, the sensor tester includes a comparator for converting the sensor current to a voltage that can be compared to a reference voltage. In some embodiments, the tester may have impedance characteristics that allow it to emulate a functional speed sensor.

The comparator circuit may be connected to a plurality of LEDs to indicate the state of the sensor by lighting one or more LEDs. As described above, in some embodiments, an active type sensor may have a defined low state and high state. In these situations, a LED indicating the low state may be powered when the current is in the proper level of the predefined lower current range. Similarly, a LED indicating the high state may be powered only when the current is in the proper level of the predefined higher current range.

In some embodiments, the active sensor may be checked by monitoring the current in the sensor circuit while turning the toothed wheel. Current flow switching between the high and low states means that the sensor is operating properly. The switching of the states may be detected by the alternative lighting of high state LED and low state LED.

Figure 4:
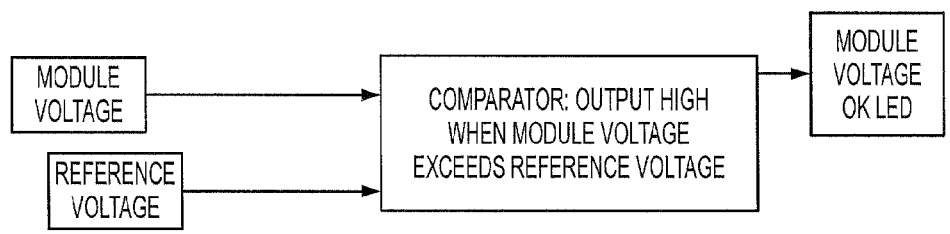
FIG. 4 shows an exemplary tester process diagram for an active wheel speed sensor, in which the circuit in a system module in a vehicle is diagnosed.

FIG. 4 shows an exemplary tester process diagram for an exemplary active wheel speed sensor tester, in which the circuit in a system control module in a vehicle is diagnosed. The active sensor requires power to operate. In some embodiments, the system control module in the vehicle such as the ABS module may provide battery-level voltage to the wheel speed sensors. In the exemplary embodiment shown in FIG. 4, a comparator may be included in the active wheel speed tester where the module voltage may be compared with a reference voltage. The comparator circuit may be connected to a LED. The LED is lighted when the module voltage output exceeds the reference voltage, which indicates that the module circuit is functioning properly or wired correctly. In one embodiment, the color of the lighted LED may be green. In other words, identifying further testing of operation of the active wheel speed sensor may be based on whether the voltage of the system control module is outside a range of the reference voltage.

In some embodiments, the tester may include a battery with proper voltage (e.g., 9-volt battery). The sensor may be powered by the on-board battery in the tester during the testing process. Thus, the tester can work independently from the power supply in the system control module and can test the sensor directly without testing the module output.

It should be appreciated that the module test portion described may be electronically isolated from the sensor test portion in some embodiments. When the module circuit is tested, the sensor may be either connected or disconnected to the system control module.

The active wheel speed sensor tester described above has several advantages. For example, the malfunctioning of an active wheel speed sensor may be due to an electronic circuit problem of the vehicle system control module (e.g., ABS) that provides power to the sensor rather than the malfunctioning of the sensor itself. If the problem in the system control module is identified, correction of the wiring or circuit may solve the trouble. Thus, further sensor testing is not needed. Such sensor testing may be time consuming and labor intensive because the testing may require powering the car and turning the wheel in some settings. Therefore, avoiding the unnecessary testing is desirable.

Further, since the tester can have impedance characteristics that mimic an actual sensor, a system control module in the vehicle (e.g., ABS module) may see the tester as a functional sensor. If the vehicle's control system indicates a problem with the ABS module, and upon plugging the tester into the system the problem goes away, it can be determined that there is no problem with the ABS module and that the perceived problem actually resulted from a bad sensor. Again, the actual testing of the sensor is not required in this case because it has already been determined that there is a problem with the sensor.

Figure 5:
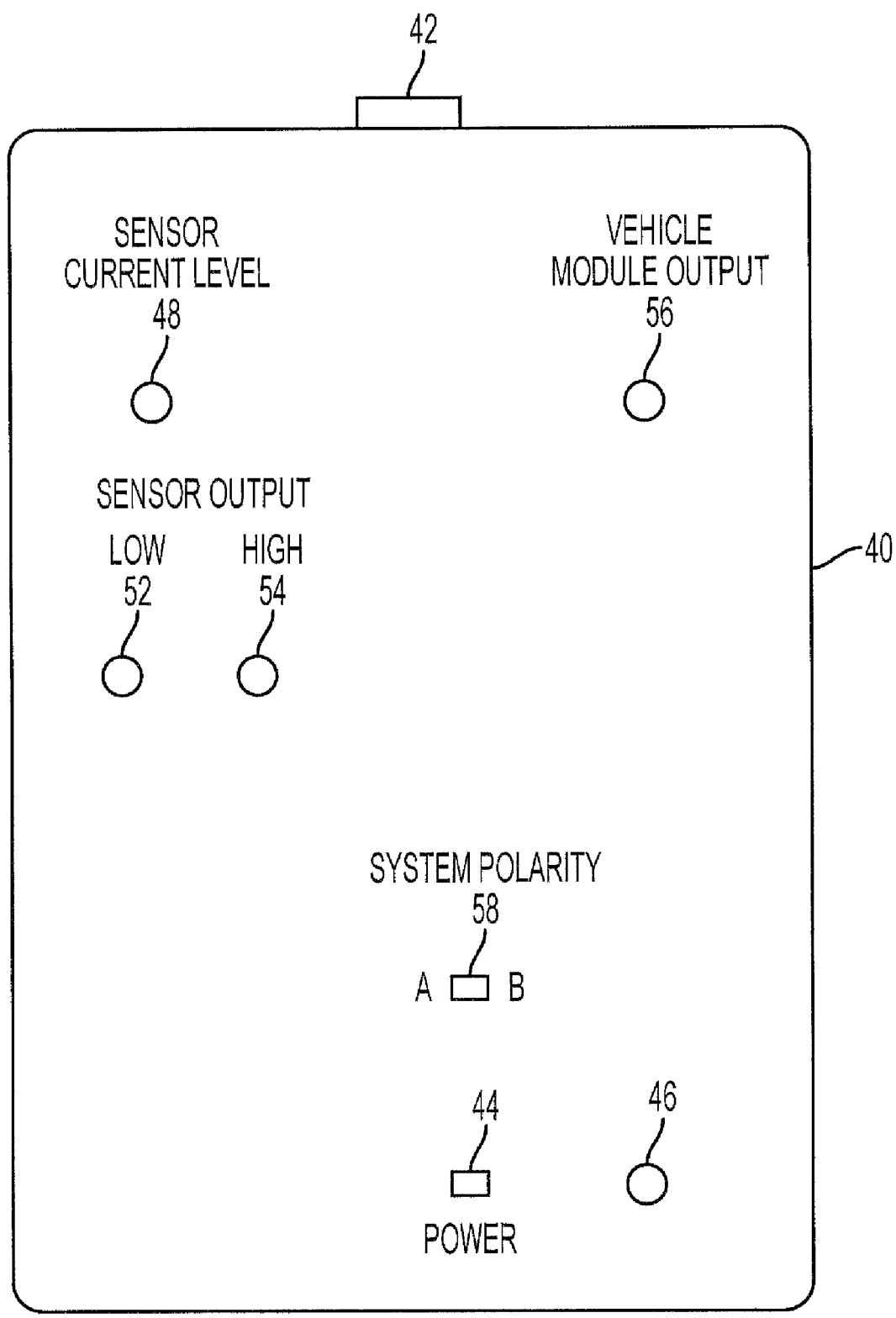
FIG. 5 shows a schematic exemplary front view of an active wheel sensor tester.

FIG. 5 shows a schematic front view of an exemplary active wheel speed sensor tester 40. In the depicted embodiment, connector 42 is detachably attached to the tester 40 to provide an electrical communication between a vehicle system control module and the tester, and electrical communication between an active wheel speed sensor and the tester. Power switch 44 is provided to turn the power supply on and off. In one embodiment, LED 46 may be used as the tester power indicator.

LED 48 indicates whether the current in the sensor circuit is at the proper level. If the current falls into the proper current ranges, one color (e.g., green) of LED may light to indicate the proper current level. If the current is outside the proper ranges, another color (e.g., red) may light to indicate circuit problems such as an open circuit, short circuit, or sensor fault. In one embodiment, the red indicates that sensor has a short circuit and needs to be replaced.

LEDs 52 and 54 can respectively indicate a low current state and a high current state. When the sensor is in the low state, LED 52 lights. When the sensor is in the high state, LED 54 lights. Thus, the sensor functions normally if LEDs 52 and 54 blink in an alternative pattern as a wheel is allowed to rotate slowly.

In some embodiments, the tester may include a system control module (e.g., ABS module) test portion. LED 56 may be connected to a circuit of the module test portion which checks the power of the circuit of the system module. Light of one color (green for example) indicates that the system control module has a proper voltage level to power the sensor.

Tester 40 may include a system polarity switch 58 that can change the polarity of the tester to match the circuit of the wheel speed sensor and the system control module. The polarity switch enables variation of a polarity of the tester without having to disconnect the tester from the active wheel speed sensor. Further, one tester may be suitable to test vehicles with different polarity configurations.

FIG. 6 shows exemplary embodiments of a detachable connection harness, and various configurations of connector located in system control modules in different vehicles. FIG. 6A illustrates a schematic diagram of the connections among an active wheel speed sensor, the active wheel speed sensor tester, and a system control module (e.g., ABS module). In the illustrated embodiment, the connection harness 60 may include a set of cables with connectors at each end of the cables. Connection harness 60 may include the tester connector 62 that may be removably attached to the tester 64 and the harness sensor connector 65 or sensor connector 65. Tester 64 may be electrically communicated with the sensor 70 through the connection between harness sensor connector 65 and the sensor side connector 72 via cable 66. In some embodiments, since sensor side connector 72 may include a female connector, harness sensor connector 65 may include a male connector to enable the connection. In other embodiments, since sensor side connector 72 may include a male connector, harness sensor connector 65 may include a female connector to enable the connection.

Connection harness 60 may further include the harness module connector 67 or module connector 67 that may be linked to tester connector 62 via the cable 68. The connection between harness module connector 67 and the module side connector 82 provides electrical communication between tester 64 and ABS module 80. Again, in some embodiments, since module side connector 82 may include a female connector, harness module connector 67 may include a male connector to enable the connection. In other embodiments, since module side connector 82 may include a male connector, harness module connector 67 may include a female connector to enable the connection. Connection harness 60 allows tester to be inserted in the sensor circuit in a way that the active wheel speed sensor and the ABS module may be tested at the same time or tested in-situ. Alternatively, the active wheel speed sensor and the ABS module may be tested separately.

Figure 6A:
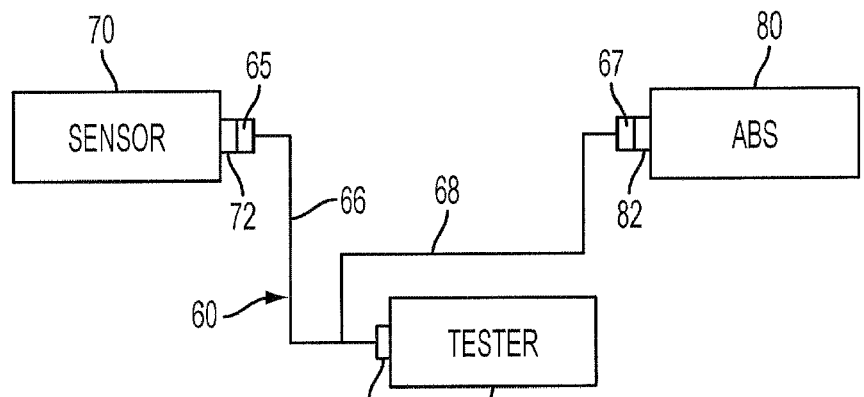
FIG. 6A illustrates a schematic diagram of the connections among an active wheel speed sensor, the active wheel speed sensor tester, and an ABS module.
Figure 6B:
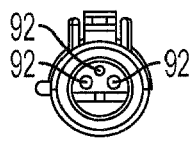
FIGS. 6B-6I shows various connectors to the active wheel speed sensor from the vehicle.
Figure 6C:
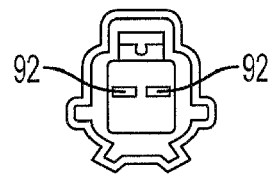
Figure 6D:
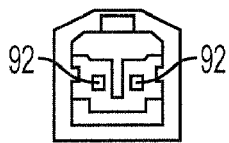
Figure 6E:
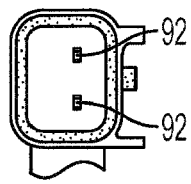
Figure 6F:
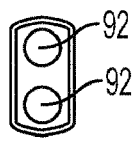
Figure 6G:
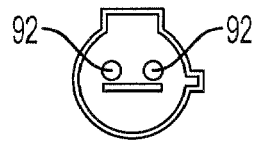
Figure 6H:
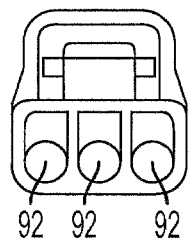
Figure 6I:
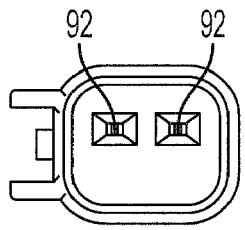

FIGS. 6B-6I shows various wheel speed sensor connectors from various vehicles. It can be seen that wheel speed sensor connectors have different configurations. Also, the number of pins 92 in the connectors may be different. For example, FIGS. 6B and 6H show connectors with three pins while FIGS. 6C-6G and 6I show connectors with two pins.

Similarly, the ABS modules in different vehicles may have different connector 82.

Thus, in some embodiments, the tester may be equipped with plurality of harness connections that fit the active wheel speed sensor and the module connectors in different types of vehicles. In this way, once the type of the sensor side or module side connector is known, a harness connection can be selected to connect the tester with the sensor or module. Thus, one tester can be used to diagnose the different wheel speed sensors in different vehicles.

Figure 7:
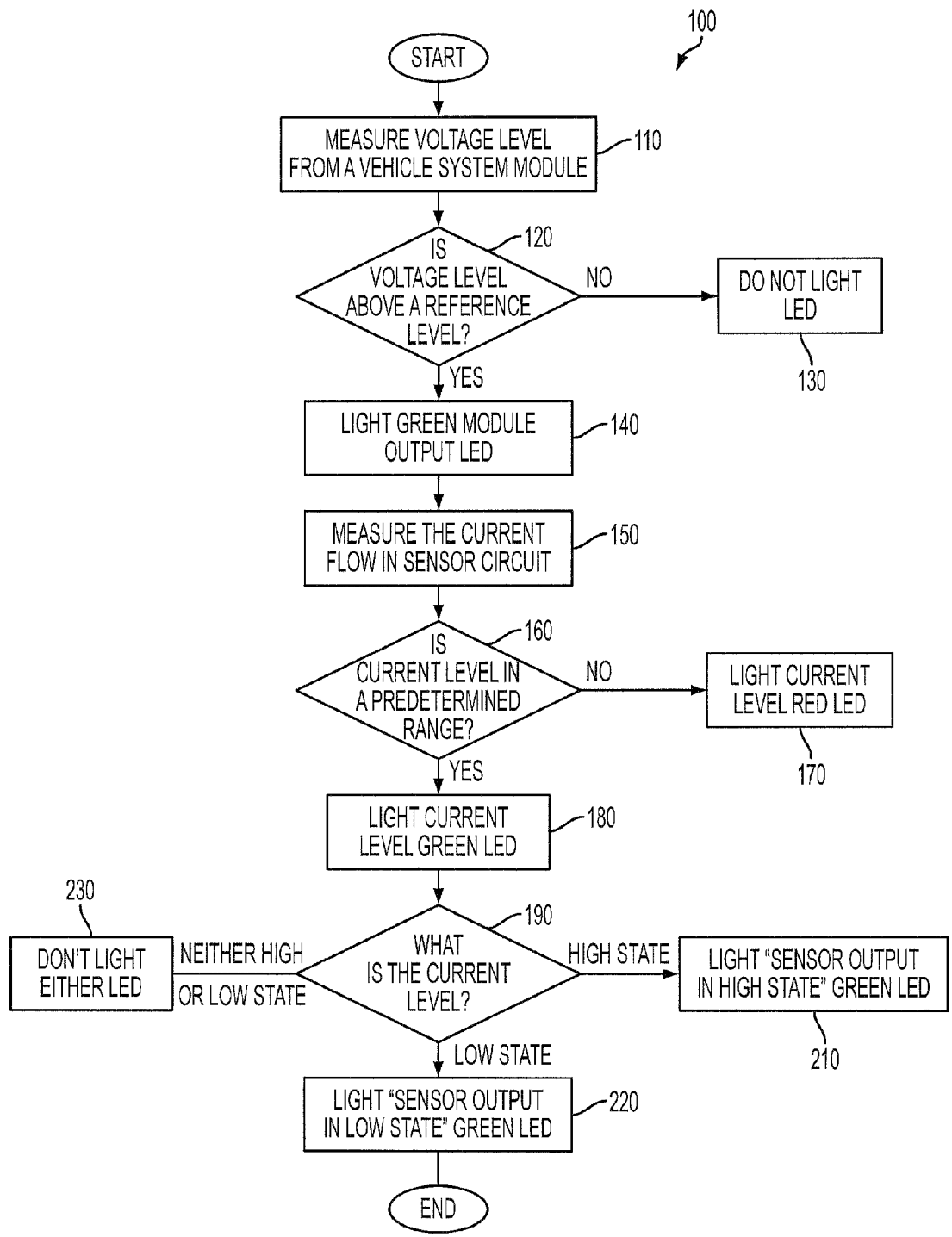
FIG. 7 is a flow chart of an operation of an active wheel speed sensor tester.

FIG. 7 is an exemplary flow chart of an operation of testing an active wheel speed sensor using a tester. First, the tester measures voltage level from a vehicle system module at 110. In one embodiment, the vehicle system module may include an anti-lock brake system (ABS). Then, at 120, it may be judged by the tester whether the voltage level is above a reference level. If the answer is no, module output LED is not lighted at 130. If the answer is yes, the module output LED is lighted green at 140. Next, the tester may measure the current flow in the sensor circuit at 150. Then, it may be judged at 160 whether the current level is in a proper range. If the answer is no, current level LED is light red at 170. If the answer is yes, the current level LED is lighted green at 180. Alternatively, in some embodiments, if the answer to 160 is no, current level LED is light red at 170. However, if the answer is yes, LED is not lighted at 180. Next, it may be judged at 190 the predefined state of current at 190. If the current is within the predefined high state, the sensor output high LED is lighted green. If the current is within the predefined low state, the sensor output low LED is lighted green. If the current is neither in the high nor low state, neither LED is lighted.

After the procedure described in FIG. 7, the tester may check the sensor in-situ. In one exemplary test procedure, a vehicle corner may be lifted to allow the wheel to rotate slowly. If the high and low current LEDs blink, the sensor functions properly. If neither LED is on, the sensor is open circuited and needs to be replaced. If only one LED is on, the sensor is stuck in one state. Adjusting sensor harness, wiring, etc. may result in the Hi/low state LEDs going out. In this situation, an open has been detected.

In some embodiments, a wheel speed sensor may be tested without being installed in a vehicle. In one exemplary procedure, a metal object may be used to mimic the tone wheel. In another procedure, a tone wheel may be used for testing. The sensor head may be moved lowly past the metal object. Next, the current state is observed. If high/low current state alternates, the sensor may be in the good condition. The steps may be repeated several times to observe the changes of the current states.

Figure 8:
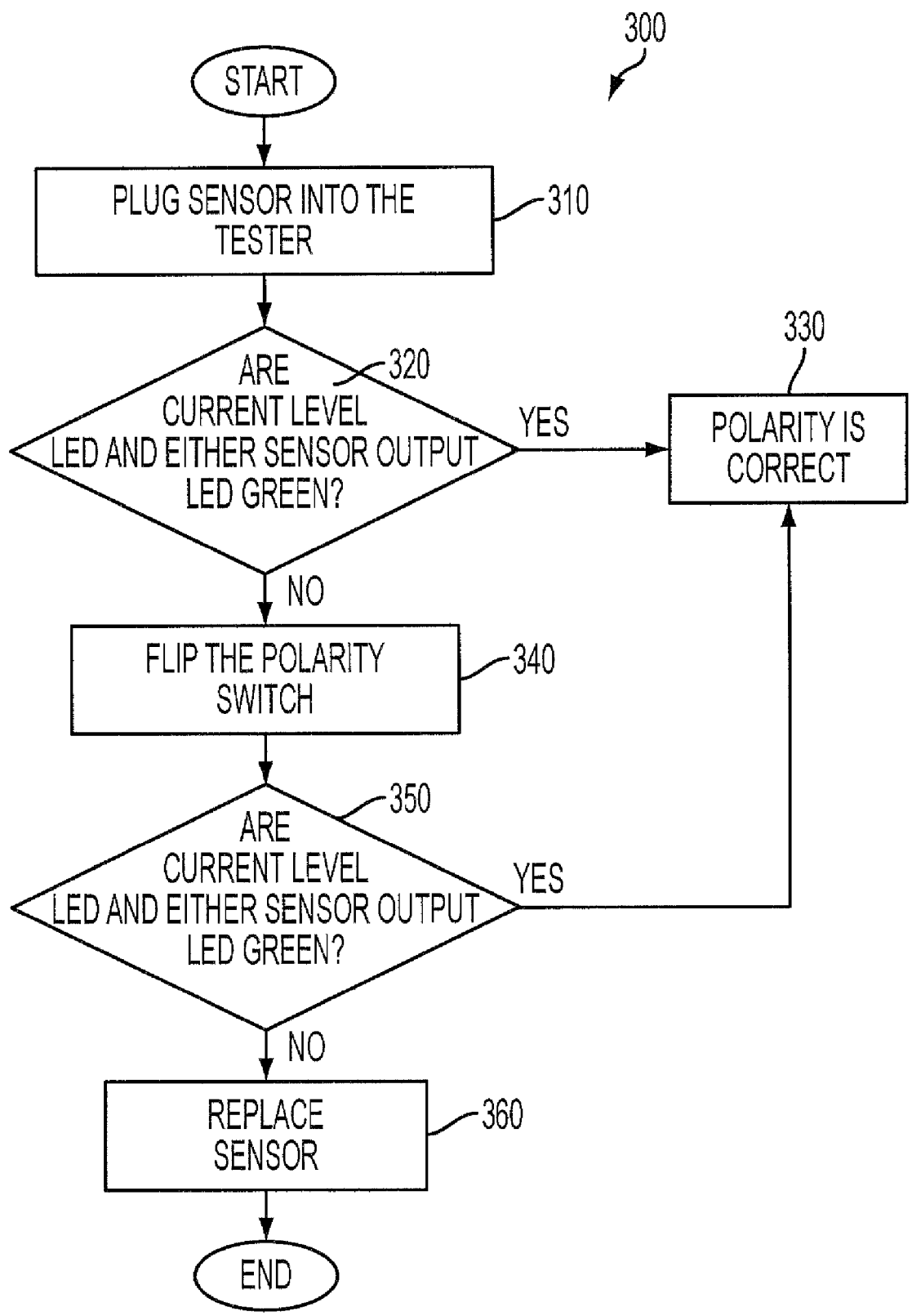
FIG. 8 is a flow chart of a procedure to check the polarity of an active wheel speed tester.

FIG. 8 is an exemplary flow chart of procedure to identify the correct polarity of the tester. In one embodiment, if the current level LED 48 and either sensor output low LED 52 or sensor output high LED 54 are green, the polarity is correct. If LED is not green, flipping system polarity switch may result in the correct polarity. However, if LED 48 remains red, the sensor may be shorted and thus may need to be replaced. Alternatively, polarity information may be provided by the manufacturer of the wheel speed sensor tester. Thus, the polarity switch can be turned on A or B as shown in FIG. 5 to match the polarity between the tester and the ABS module or the wheel speed sensor based on polarity information on the vehicle to be tested.

It will be appreciated that the configurations and routines disclosed herein are exemplary in nature, and that these specific embodiments are not to be considered in a limiting sense, because numerous variations are possible. The subject matter of the present disclosure includes all novel and nonobvious combinations and subcombinations of the various systems and configurations, and other features, functions, and/or properties disclosed herein.

The following claims particularly point out certain combinations and subcombinations regarded as novel and nonobvious. These claims may refer to "an" element or "a first" element or the equivalent thereof. Such claims should be understood to include incorporation of one or more such elements, neither requiring nor excluding two or more such elements. Other combinations and subcombinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A tester for testing an active wheel speed sensor of a vehicle, comprising:
   an indication portion having a plurality of indicators;
   a module testing portion configured to assess operation of a system control module of the vehicle by monitoring an electrical output from the system control module to cause indication of proper operation of the system control module with a first indicator of the plurality of indicators, and to identify whether further testing of operation of the active wheel speed sensor is needed;
   a sensor testing portion configured to assess operation of the active wheel speed sensor and to cause indication of proper operation with a second indicator of the plurality of indicators; and
   a tester connector provided on the tester, the tester connector being configured to connect to a connection harness that is detachably connectable to the vehicle, to electrically connect the tester to the system control module and the active wheel speed sensor in situ in the vehicle, at the same time or independently, via a respective sensor connector and a module connector of the detachable connection harness;
   wherein the indication portion is electrically communicated to an electronic circuit of the module testing portion and an electronic circuit of the sensor testing portion and the first indicator and the second indicator are LEDs;
   wherein the electronic circuit of the sensor testing portion detects if a current in the active wheel speed sensor is in a predetermined range, a predetermined high current state, or a predetermined low current state, and is configured to light a current level LED if the current is outside the predetermined range, and to light a high current state LED if the current is in the predetermined high current state, and to light a low current state LED if the current is in the predetermined low current state; and
   wherein proper function of the active wheel speed sensor is indicated by blink of the lighting of the high current state LED and the low current state LED while a wheel is turned.

2. The tester of claim 1 wherein the wheel speed sensor is a Hall effect sensor.

3. The tester of claim 1 wherein the system control module is an anti-lock braking system (ABS) module and the module testing portion is configured to assess operation of the ABS module.

4. A tester for diagnosing an active wheel speed sensor of a vehicle, comprising:
   an indication portion including a first set of indicators and a second set of indicators;
   a module testing portion electrically communicated to the indication portion and configured to assess operation of a system control module by monitoring an electrical output from the system control module; to cause indication of proper operation of the system control module with the first set of indicators; and to identify whether further testing of operation of the active wheel speed sensor is needed;
   a sensor testing portion electrically communicated to the indication portion and to assess operation of the active wheel speed sensor and to cause indication of proper operation of the active wheel speed sensor by the second set of indicators; and
   a polarity switch electrically communicated to the module testing portion and the sensor testing portion to match an electronic circuit of the wheel speed sensor and an electronic circuit of the system control module, thereby enabling variation of a polarity of the tester without having to disconnect the tester from the active wheel speed sensor.

5. The tester of claim 4 wherein the proper operation of the system control module is determined by comparison between a voltage of the system control module and a reference voltage.

6. The tester of claim 5 wherein identifying further testing of operation of the active wheel speed sensor is based on whether the voltage of the system control module exceeds the reference voltage.

7. The tester of claim 5 wherein the tester further comprises impedance characteristics that mimic the active wheel speed sensor.

8. The tester of claim 5 wherein the first set of indicators and second set of indicators are LEDs; the sensor testing portion includes electronic circuits to detect if a current in the active wheel speed sensor is in a predetermined range, a predetermined high current state, or a predetermined low current state wherein a current level LED is lighted if the current is outside the predetermined range, a high current state LED is lighted if the current is in the predetermined high current state, and a low current state LED is lighted if the current is in the predetermined low current state.

9. The tester of claim 8 wherein proper operation of the active wheel speed sensor is indicated by blink of the lighting of the high current state LED and the low current state LED while a wheel is turned.

* * * * *